(12) United States Patent
Lecheler et al.

(10) Patent No.: US 7,046,512 B2
(45) Date of Patent: May 16, 2006

(54) OPERATING CIRCUIT FOR A LAMP WITH A HEAT SINK

(75) Inventors: Reinhard Lecheler, Neuburg/Donau (DE); Oskar Schallmoser, Ottobrunn (DE)

(73) Assignee: Patent-Treuhand & Gesellschaft fuer Elektrische Gluehlampen mbH, Munich (DE)

( * ) Notice: Subject to any disclaimer, the term of this patent is extended or adjusted under 35 U.S.C. 154(b) by 0 days.

(21) Appl. No.: 10/958,379

(22) Filed: Oct. 6, 2004

(65) Prior Publication Data
US 2005/0078458 A1 Apr. 14, 2005

(30) Foreign Application Priority Data
Oct. 14, 2003 (DE) ................ 103 48 421

(51) Int. Cl.
*G06F 1/20* (2006.01)

(52) U.S. Cl. ............. 361/687; 361/740; 439/347; 248/681

(58) Field of Classification Search ........ 361/679–687, 361/724–727, 697, 720; 257/703, 723; 165/104, 165/33; 362/648
See application file for complete search history.

(56) References Cited

U.S. PATENT DOCUMENTS

| | | | |
|---|---|---|---|
| 4,803,586 A * | 2/1989 | Tabor et al. ............. | 361/18 |
| 2002/0126453 A1 * | 9/2002 | Ubukata ............. | 361/720 |
| 2002/0181200 A1 * | 12/2002 | Chang ............. | 361/687 |
| 2004/0056346 A1 * | 3/2004 | Palm et al. ............. | 257/706 |

FOREIGN PATENT DOCUMENTS

DE 43 32 115 A1 * 9/1993

* cited by examiner

*Primary Examiner*—Hung Van Duong
(74) *Attorney, Agent, or Firm*—Robert F. Clark

(57) ABSTRACT

The invention relates to a circuit for operation of a lamp with a component 4 to be cooled and with a heat sink 6, 6' which includes an angle of 10°–70° with a circuit board 1.

14 Claims, 3 Drawing Sheets

OPERATING CIRCUIT FOR A LAMP WITH A HEAT SINK

TECHNICAL FIELD

The present invention relates to an electrical circuit for operation of a lamp which has a heat sink.

BACKGROUND ART

It is known for electronic components which produce operating heat to a considerable extent during operation, for example power transistors, in operating circuits for lamps to be cooled by means of heat sinks. In general, these are conventionally sheet metal structures, which either transfer the heat to be dissipated to the housing by coupling to a housing wall or—without any housing contact—provide cooling by means of thermal conduction and thermal radiation, by emission of the heat to the surrounding area. The heat sinks may in this case be held on the component, may be held on the housing of the circuit, and/or may also be held on a circuit board on which the component is itself mounted.

DISCLOSURE OF THE INVENTION

The invention is based on the technical problem of specifying an electrical operating circuit for lamps with a better heat sink for components which develop heat.

The invention is based on an electrical circuit for operation of a lamp, which circuit has: at least one electronic component which produces operating heat during operation, a circuit board on which the electronic component is mounted, and a heat sink for dissipation of the operating heat from the electronic component, with the electronic component resting flat on a contact surface of the heat sink, which contact surface includes an angle of 10°–70° with the circuit board, and to a corresponding method for mounting the component in the electrical circuit.

The basic idea of the invention is for the contact surface of the heat sink, which generally corresponds to one of the main faces of a heat sink that is composed of sheet metal, not to be aligned in the conventional manner at right angles to or parallel to the plane of the board, but at an angle to it. In this case, the possible angles are angles which differ significantly from 0° and from 90°, for which reason the range from 10°–70° is taken as a basis. Reference is therefore made to the acute angle included between the contact surface and a plane which is parallel to the circuit board. However, this covers not only embodiments in which the contact surface is on the face of the heat sink facing away from the circuit board, but also embodiments in which it is on the face of the heat sink facing the circuit board.

Specifically, it has been found that, in many cases, a plane-parallel solution leads to an excessively large lateral amount of space being required on the board and, on the other hand, a vertical solution often results in excessive physical heights. Since these fixed predetermined angles are not used and an angle of at least 10° with respect to the parallel solution, or at least 20° with respect to the vertical solution, is adopted, these disadvantages can be avoided, to be precise either paying more attention to the space requirements on the board or more to the overall physical height, depending on the particular application. The angling with respect to the plane/parallel solution furthermore results in space being created under the heat sink or, in the case of a component resting on its side facing the circuit board, under this component, which space is then available for other purposes on an individual basis. For example, flat components such as surface-mounted devices may thus be arranged on a part of the surface under the heat sink or under the cooled component. However, it is particularly preferable for conductor tracks to be provided there.

The contact surface of the heat sink is used to make thermal contact between the electronic component and the heat sink, and should thus essentially be suitable for flat contact with the component. Generally, this means that the component is essentially flat on the corresponding side, in the same way as the contact surface. However, other surface shapes may also be used in particular cases, provided that good heat transfer is ensured.

The expression "lamp" in this case generally means technical radiation sources of widely differing types, in particular including lamps which produce invisible light such as UV light or IR light, as well as lamps whose light is not used for illumination per se, for example for indoor lighting, but to carry out different types of technical functions. The expression "operating circuit" or "circuit for operation of a lamp" in this description also means any circuit type which supplies power to the lamp and/or controls the lamp and/or its supply circuit. However, the invention is in this case preferably based on electronic ballasts for operation of lamps, in particular discharge lamps or halogen incandescent lamps.

The heat sink is preferably mounted directly on the same circuit board as that on which the electronic component is mounted. This can preferably be achieved by means of slots in the circuit board, through which parts of the heat sink pass, for example by mounting legs on a sheet metal heat sink being passed through the slots. It is furthermore preferable for the heat sink to be secured by bending of the parts which pass through the slots, for example by the sheet metal legs being bent around, in particular twisted, on the other side of the board. In this case, the heat sink part which passes through the slots for assembly may have a contact edge at board level. This makes it possible to define the installation height by this contact edge, for example an undercut edge that is formed by means of an incision, being brought into contact with the board.

In the case of an electrically conductive heat sink, in particular a heat sink composed of sheet metal, contact can be made via the slots by metallizing them and by making appropriate connections to the metallizations. It is thus possible, for example, to use the heat sink for shielding.

In this case, the invention is furthermore preferably based on a heat sink which if required has no housing, and which is thus not used to conduct heat to a housing but for "autonomous" cooling. Heat sinks such as these may be used in particular in so-called "open frame" circuits without a housing, in this actual sense.

The described angles between the heat sink contact surface and the circuit board of between 10° and 70° are preferably distinct from the stated limits, to be precise in particular preferably being not more than 35°, particularly preferably not more than 32° and in the best case not more than 30°. However, the intermediate values between the upper value of 70° and the value of 35° are also increasingly preferred as an upper limit in a corresponding sequence, that is to say, for example, the values 60°, 50° and 40°. Furthermore, the values 15°, 18° and 20° are preferred in this sequence as lower limits. In many cases, this results in good overall physical heights, with a lateral space requirement that is reduced overall.

As has already been mentioned, the electronic component may be provided on the "upper face" or "lower face". However, the upper face is preferred in this case, that is to say the side facing away from the circuit board. Assembly is generally easier in this case, and the component is more accessible. However, the opposite conditions may also occur in specific cases, for example owing to screening or other problems.

Furthermore, it is preferable for the heat sink to be provided not only for a single electronic component but for two or more of them, and for these components in this case to be arranged in a row. The direction of the row arrangement is in this case essentially parallel to the circuit board plane and at right angles to the inclination direction (that is to say to the gradient) of the oblique contact surface.

Finally, it is preferable for the component to be bracketed via an elastic spring onto the contact surface. However, in principle, other assembly options are also feasible. In particular, owing to special vibration or shaking problems, or in order to achieve a particularly good thermal contact, it may be necessary to provide a very firm connection, in which case screwing or riveting of the component is then preferred. In this case, an aid may, of course, be used for fitting the screw or riveting, for example a clamping plate which has to be screwed or riveted on. Screwing or riveting in this case means that the pressure that is essential for the contact is provided by the screw thread or by the rivets, and not by significant intrinsic elasticity as in the case of a spring.

The preferred spring may in turn be plugged onto the heat sink, that is to say in particular may be inserted into a lug or may be passed through a slot which leads to the opposite side of the heat sink. The spring can then carry out its function simply by an interlock, without any further attachment measures.

However, a screw connection may also be used for the elastic spring itself, in order to secure it particularly well. In this case, it is preferably screwed to the upper face of the heat sink, that is to say on the side facing away from the circuit board. During production, such a screw connection can also be produced by an automatic screw driving machine.

The spring itself may also at the same time be used to provide a cooling capability. For this purpose, it preferably has at least one bent-up surface section, for example a section which is bent up adjacent to the part gripping the component. This makes it possible to enlarge the total surface area for heat dissipation and thermal radiation by the spring and, with suitable bending, nevertheless to retain the capability for matching to the desired overall physical height or lateral physical size. Reference should be made to the exemplary embodiment, for illustration.

The heat sink may also have more than one inclined contact surface, in particular two contact surfaces, which each include an acute angle with the circuit board. These contact surfaces are then preferably adjacent to one another "like a roof gable", that is to say with the boundary line between the contact surfaces running transversely with respect to the inclination direction, and with the contact surfaces being adjacent to one another in the inclination direction.

In this case, one of the two faces may, for example, be used for attachment of elastic springs, or else two contact surfaces may be used to make contact with components to be cooled. These are preferably in this case located in an alternating row, thus providing advantageous capabilities for accommodation of springs for attachment of the components.

The invention will be explained in more detail in the following text with reference to exemplary embodiments, in which case the features which are described in the process may also be significant to the invention in other combinations. Apart from this, the present description and the following description at the same time relate to the apparatus character and the method character of the invention, without drawing any distinction in detail between them in the description.

BEST MODE FOR CARRYING OUT THE INVENTION

Figure 1:
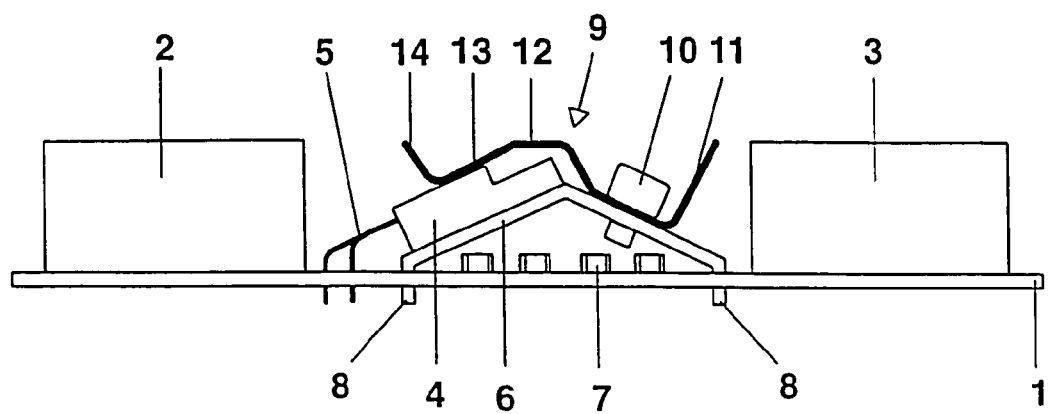
FIG. 1 shows a schematic side view of a circuit according to the invention.

FIG. 1 shows an intrinsically conventional circuit board 1 for an electronic ballast for a discharge lamp, in this case for a flat lamp which operates on the principle of a dielectric barrier discharge, for back-lighting of LCD monitors. In this case, electronic components 2 and 3, which will not be explained in any more detail, are mounted on the circuit board 1, as is a power transistor 4, which forms an electronic component that is to be cooled. The power transistor 4 is connected to conductor tracks on the circuit board 1 via contact legs, which are annotated 5, and would conventionally either be positioned pointing vertically upward, or would be bent away horizontally to the side. However, in this case, it is inclined at an angle of 25° with respect to the circuit board 1, with its planar lower face resting on a contact surface on a heat sink 6, which is likewise oriented at 25° with respect to the circuit board 1.

The heat sink 6 has a cross section which is essentially in the form of a roof gable with two halves which form mirror images of one another and are each oriented at 25° with respect to the circuit board 1, and which each form contact surfaces that point upward, for the purposes of the invention. A corresponding cavity is left free by the heat sink underneath and can be used for further flat circuit elements 7, for example conductor tracks, surface mounted devices or the like.

Figure 6:
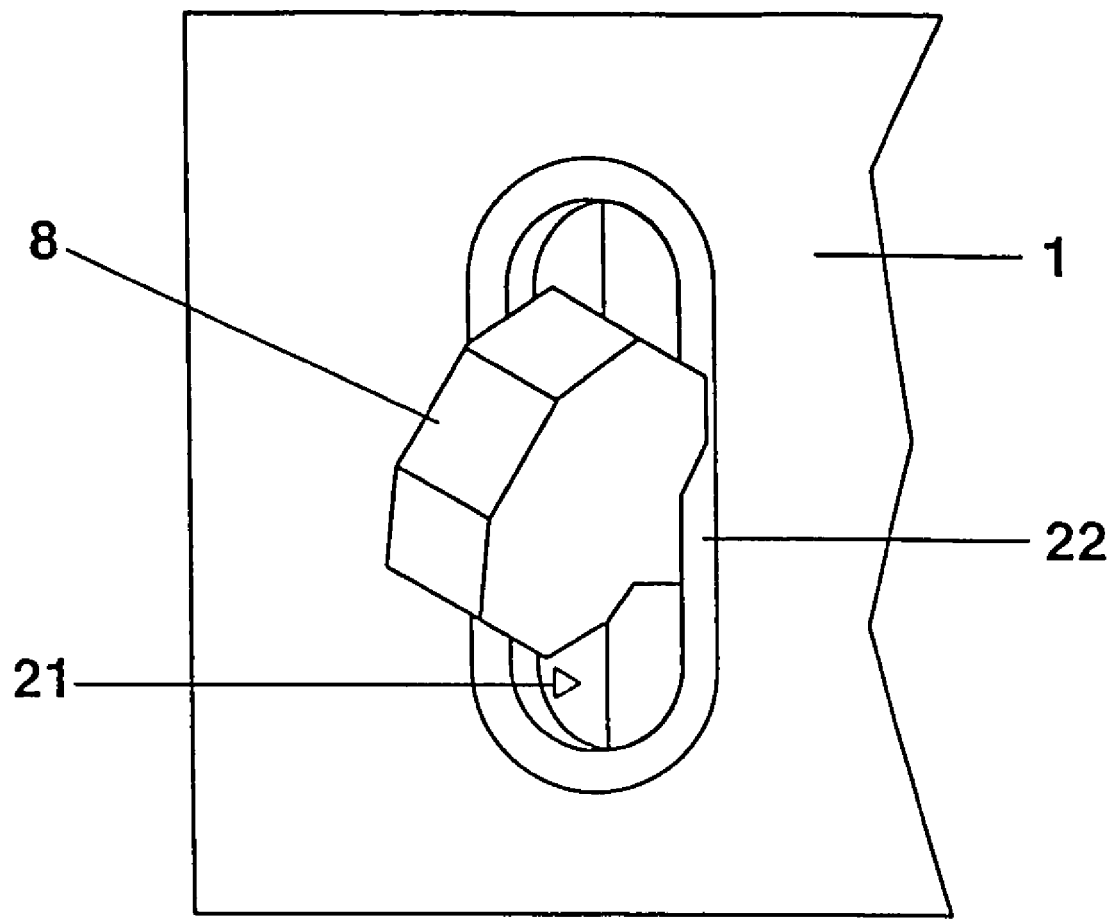
FIG. 6 shows a detail relating to the mounting of the heat sink shown in FIGS. 1 to 3 on a circuit board.

The heat sink 6 is composed of conventional sheet metal, as is also otherwise used for heat sinks, and is anchored on the circuit board 1 via mounting legs 8 which are illustrated only symbolically here. The mounting legs 8 are held in metallized and electrically connected slots in the circuit board 1, so that the heat sink 6 is connected to the circuit ground. Reference should be made to FIG. 6.

According to this exemplary embodiment, the heat sink 6 has two contact surfaces, which respectively point upward to the left and upward to the right in FIG. 1. The power transistor 4 is located on the left upper contact surface, while an elastic spring 9 is screwed by means of a screw 10 into a thread in the heat sink 6 on the right upper contact surface.

The elastic spring 9 in FIG. 1 has a section 11 which is bent up at right angles to the right of the screw 10, and merges at the left from the screw 10 into a section 12 which is essentially parallel to the circuit board and itself merges into a section 13 which forms a somewhat larger angle with the circuit board 1 than the contact surface of the heat sink 6. For this reason, the lower part of this section 13 rests on the upper face, which is parallel to the lower face of the power transistor 4, and forms a defined contact area for the clamping function. From this contact area, the elastic spring 9 is in turn bent away upward through about 90° with respect to the section 13, to form a further bent-up section 14. The bent-up section 11 is used to enlarge the surface of the spring 9, which is essential for the cooling function, and also for handling of the spring while the spring itself is being installed. The section 12 is for this reason designed to be flat with respect to the adjacent sections on the right and left, in order not to exceed the overall physical height, which is also not exceeded by the bent-up sections 11 and 14. The overall structure is thus only insignificantly higher than the right-hand upper edge of the power transistor 4 which can be seen in FIG. 1. The bent-up section 14 is once again firstly used to enlarge the spring surface area and, on the other hand, can also be used to push the spring over the power transistor 4 better.

The screw attachment via the screw 10 has the advantage of very reliable mechanical attachment which, in particular, is resistant to vibration and also ensures a permanent electrical contact with the spring 9. It can also be involved in the shielding function, which has been mentioned with regard to making electrical contact with the heat sink itself.

Figure 2:
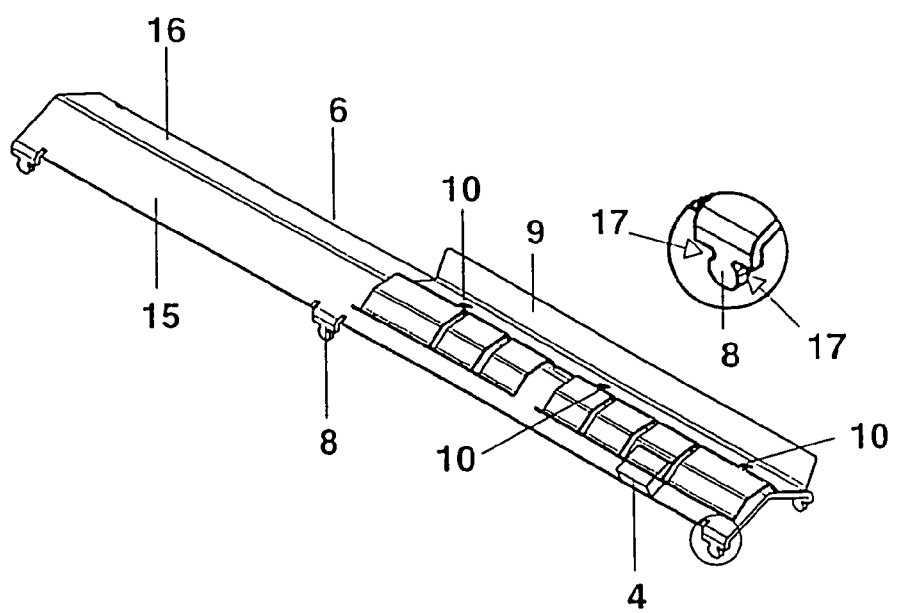
FIG. 2 shows a perspective view of a heat sink according to the invention.

FIG. 2 shows a perspective illustration of the heat sink 6 shown in FIG. 1 with the two contact surfaces, which are annotated 15 and 16 here, as well as the mounting legs 8 of the heat sink 6, which are illustrated in more detail here. The enlarged illustration contained in the right-hand circle in FIG. 2 shows that these mounting legs 8 have incisions 17 which come to rest at the level of the circuit board 1 in the assembled state.

Those edges of the legs which are adjacent to the incisions 17 at the top make contact with the circuit board 1. Once again, reference should be made to FIG. 6.

FIG. 2 furthermore shows the elastic spring 9 which, as is clearly illustrated in FIG. 2, extends along the direction at right angles to the plane of the drawing in FIG. 1 and offers a number of individual spring sections for attachment of a number of components 4, in the sections 12, 13 and 14. One component is indicated by way of example in FIG. 2 while, in contrast, the other spaces are left free. As can be seen, the heat sink which is illustrated in FIG. 2 may be fitted with two of the illustrated springs 9, although only one is shown, and each spring 9 may hold in the order of magnitude of five to ten components 4, with the specifically illustrated spring 9 being designed overall for seven components 4, which can be installed separately and have different thicknesses, as a consequence of having broadened outer sections and an enlarged distance between individual spring elements in the center. However, two or more components which each have the same thickness can also be mounted in the broadened sections.

Figure 3:
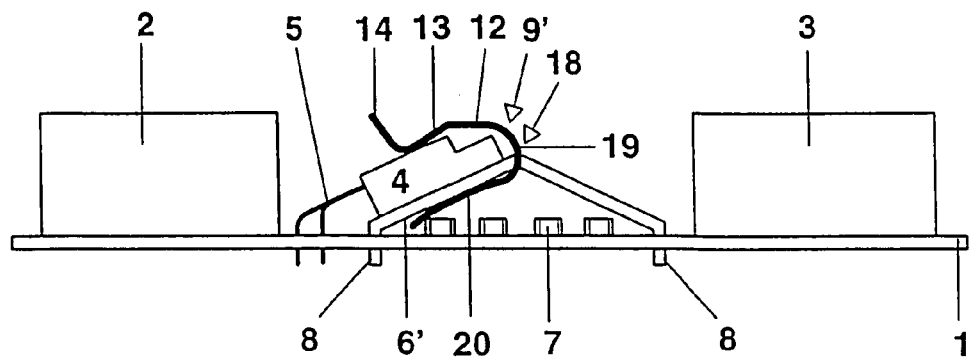
FIG. 3 shows a schematic side view of a further exemplary embodiment of a circuit according to the invention.

FIG. 3 shows an alternative embodiment in the form of an illustration approximating that in FIG. 1. Corresponding elements and features are annotated analogously. In contrast to FIG. 1, however the heat sink 6' in this case has a slot 18, which is located in the roof gable, and through which a section 19 of the spring is passed, which is adjacent to the horizontal section 12 of the spring 9' and is curved through approximately 180°. This section 19 of the spring 9' merges into a slightly (seen from underneath) concave section 20, which engages behind the lower face of the contact surface 15 of the heat sink 6', and thus allows the component 4 to be clamped by means of the section 13 on the other side. The spring 9' thus has a shape similar to a U overall, which can be passed through the slot 18, thus allowing installation without any separate screw attachment. Furthermore, it occupies only the left-hand half of the heat sink 6'.

Overall, the circuit shown in FIGS. 1 and 3 is in each case a so-called "open frame" circuit, which is thus formed just on a board 1 without any further surrounding housing.

Figures 4, 5:
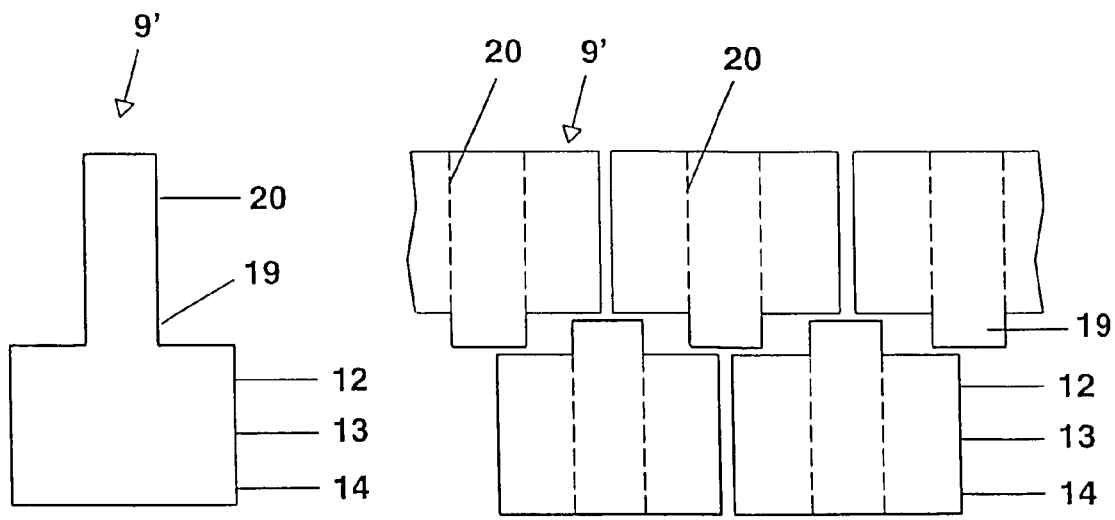
FIGS. 4 and 5 show, in the form of a plan view, details relating to a spring in the exemplary embodiment shown in FIG. 3.

In order to assist understanding, FIG. 4 shows the metal sheet that is used to produce the spring 9' in the flat state, seen from above, illustrating that the spring 9' is considerably narrower in the area of the sections 19 and 20 than in the area of the other sections 12, 13 and 14. Components 4 can thus be mounted on both contact surfaces 15 and 16 on a heat sink 6' which, apart from this, corresponds to the heat sink 6 shown in FIG. 2, but is provided with a slot 18, with the springs 9' being fitted as is illustrated schematically in FIG. 5. Specifically, they alternate in the roof gable direction, so that the components which are held by them come to rest essentially closely adjacent. In FIG. 5, the dashed lines denote the sections 20 which are covered by the sections 12, 13 and 14 located above them. The shading indicates the curvatures.

FIG. 6 shows, schematically, the mounting of the heat sinks 6 and 6' as shown in FIGS. 1 to 3 on the circuit board 1. The already-mentioned mounting legs 8 are passed through slots, which are annotated 21, and are locked by a twisting bending action on the lower face of the circuit board 1. In this case, FIG. 6 shows a view of the circuit board 1 from underneath, and of the lowermost area of one mounting leg 8. The incisions 17 which are shown in FIG. 2 absorb the majority of the bending, so that the "head", which is located underneath, prevents the heat sink 6 from being pulled out again. In this case, the circuit leg 8 makes electrical contact with a metallization 22 on the lower face of the slot, although this is also present on the inner faces of the slot and on the upper face, and is connected to a conductor track. This form of assembly has been found to be particularly simple and time-saving and, with regard to the plastic deformation of the mounting leg 8 and the clamping produced in the process, has also been found to provide a sufficient electrical contact between the mounting leg 8 and the metallization 22. Furthermore, if the thermal expansion of the heat sink 6 is not the same as that of the circuit board 1, the mounting leg 8 can if necessary move somewhat within the slot 21, which ensures good thermal characteristics with regard to the considerable length of the heat sink 6, as can be seen in FIG. 2, in comparison to its width. The entire heat sink 6 is once again somewhat elastic in the transverse direction, and can thus compensate for thermal expansion differences.

Thus, overall, the invention not only results in a considerably reduced physical height which, in a specific case, may also be oriented to electronic components 2 and 3 in the vicinity, but, furthermore, also results in low component parts costs and in the capability for simple and thus low-cost assembly. The amount of lateral space required is less than that for a horizontal geometry, and it is also possible to achieve component placement options and capabilities for conductor track routing underneath the heat sink. Furthermore, it is also easy to make electrical contact with the heat sink, by means of the described assembly process. Finally, if required, it can also be used to provide mechanical robustness for the mounting board.

What is claimed is:

1. An electrical circuit for operation of a lamp, comprising:
   at least one electronic component which produces operating heat during operation;
   a circuit board on which the electronic component is mounted; and
   a heat sink for dissipation of the operating heat from the electronic component, the electronic component resting flat on a contact surface of the heat sink, which contact surface includes an angle of 10°–70° with the circuit board, the heat sink being mounted directly on the circuit board through slots in the circuit board, which slots are larger than those parts of the heat sink which in each case pass through them.

2. The circuit as claimed in claim 1, in which the heat sink is pushed through the slots, and is secured in them by bending.

3. The circuit as claimed in claim 1, in which the slots in the circuit board are metallized, and the heat sink is composed of an electrically conductive material and makes electrical contact in the slots via the metallization.

4. The circuit as claimed in claim 2, in which those parts of the heat sink which in each case pass through the slots have a contact edge at the level of the circuit board.

5. An electrical circuit for operation of a lamp, comprising:
   at least two electronic components which produce operating heat during operation;
   a circuit board on which the electronic components are mounted; and
   a heat sink for dissipation of the operating heat from the electronic components, the electronic components resting flat on a contact surface of the heat sink, which contact surface includes an angle of 10°–70° with the circuit board, the electronic components resting on the contact surface of the heat sink in a row along a direction which is at right angles to the inclination direction of the contact surface and is parallel to the circuit board.

6. An electrical circuit for operation of a lamp, comprising:
   at least one electronic component which produces operating heat during operation;
   a circuit board on which the electronic component is mounted; and
   a heat sink for dissipation of the operating heat from the electronic component, the electronic component resting flat on a contact surface of the heat sink, which contact surface includes an angle of 10°–70° with the circuit board, the electronic component being bracketed to the contact surface via an elastic spring.

7. The circuit as claimed in claim 6, in which the elastic spring is screwed to the heat sink.

8. The circuit as claimed in claim 6, in which the elastic spring is plugged onto the heat sink.

9. The circuit as claimed in claim 6, in which the elastic spring has at least one section which is bent up with respect to the contact surface of the heat sink.

10. An electrical circuit for operation of a lamp, comprising:
    at least one electronic component which produces operating heat during operation;
    a circuit board on which the electronic component is mounted; and
    a heat sink for dissipation of the operating heat from the electronic component, the heat sink having two contact surfaces, each contact surface including an angle of 10°–70° with the circuit board and being adjacent to one another in the inclination direction, each electronic component resting flat on one of the contact surfaces of the heat sink.

11. The circuit as claimed in claim 10, in which electronic components rest on both contact surfaces.

12. The circuit as claimed in claim 10 wherein an elastic spring holds each electronic component to the heat sink.

13. The circuit as claimed in claim 11, in which the electronic components rest on the two contact surfaces in an alternating row.

14. The circuit as claimed in claim 12 wherein the elastic spring is U-shaped and a portion of the spring is inserted through a slot in the heat sink.

* * * * *